United States Patent [19]
Iijima

[11] Patent Number: 4,570,059
[45] Date of Patent: Feb. 11, 1986

[54] AUTOMATIC LENS FOCUS WITH RESPECT TO THE SURFACE OF A WORKPIECE

[75] Inventor: Nobuo Iijima, Tama, Japan

[73] Assignee: Fujitsu Limited, Kawasaki, Japan

[21] Appl. No.: 563,655

[22] Filed: Dec. 20, 1983

[30] Foreign Application Priority Data

Dec. 28, 1982 [JP] Japan .................................. 57-228703

[51] Int. Cl.$^4$ .................................................. G01C 3/08
[52] U.S. Cl. ........................................ 250/201; 250/204; 354/4
[58] Field of Search .............. 250/201, 201 AF, 204; 354/402, 403, 406, 408, 409; 356/1, 4, 375

[56] References Cited

U.S. PATENT DOCUMENTS

4,233,502 11/1980 Bouwhuis et al. .................. 250/204
4,257,705 3/1981 Hosoe et al. .................. 250/201 AF

*Primary Examiner*—Edward P. Westin
*Attorney, Agent, or Firm*—Staas & Halsey

[57] ABSTRACT

An automatic focus control device for adjusting the height of a lens above a surface of a workpiece used in an exposure apparatus for exposing the sample with a light beam including a first light emitting device for emitting a first light ray to a sample; a second light emitting device for emitting a second light ray to the sample. First and second light detecting devices for detect the second and first light rays reflected by a surface of the sample, respectively. The first and second light detecting device have a plurality of light detecting elements. A discriminating device discriminating between an inclination of the sample and a variation of the height of the lens above the surface of the sample on the basis of an output of the first and second light detecting devices. The first light emitting device and the first light detecting device are symmetrically located with respect to the second light emitting device and the second light detecting device in relation to a center axis of a light beam for exposing the sample.

10 Claims, 12 Drawing Figures

PRIOR ART

AUTOMATIC LENS FOCUS WITH RESPECT TO THE SURFACE OF A WORKPIECE

BACKGROUND OF THE INVENTION

1. Field of the Invention

The present invention relates to an exposure apparatus, more particularly, to an automatic focus control device used in an exposure apparatus in the production of an integrated circuit.

2. Description of the Prior Art

Recent research and development projects in the field of integrated circuits (IC's) and large-scale integrated circuits (LSI's) have concentrated on the achievement of greater miniaturization of the elements and higher integration of the circuit patterns. In the production of these IC's, the so-called stepper exposure apparatus, equipped with a reduction lens, is used to expose a wafer. In this process, the focal depth of the reduction lens is usually in the range of about 1 $\mu$m. However, the surface of the wafer or workpiece usually has several bumps or depressions, and the depth of these bumps or depressions is usually in the range of from 5 $\mu$m as a minimum value to 10 $\mu$m as a maximum value. For this reason, it is necessary to repeatedly adjust the focus of the reduction lens to correspond to the height of the surface of the wafer by an automatic adjustment. In order to automatically adjust the focus, it is necessary to precisely measure the height of the reduction lens from the wafer to be exposed.

A well-known technique for measuring the height of the wafer to be exposed is that of using an air-micrometer or of utilizing electrostatic capacity. In the case of the air-micrometer, the air used for measuring the height cannot be blown against the center portion of the exposing portion because the light beam used to expose the wafer is located at that portion. Therefore, in order to measure the height of the portion of the wafer to be exposed, the air used for measuring the height is blown against a peripheral portion of the wafer. The height of the center portion of the exposing portion is then presumed from the values obtained when measuring the height of the peripheral portion. When electrostatic capacity is used, as with the air-micrometer, a sensor for measuring the electrostatic capacity cannot be provided on the center portion of the exposing portion. The height of the center portion of the exposing portion, therefore, is similarly presumed from the values obtained when measuring the height of the peripheral portion.

Further, when one of the chips located near the edge of the wafer on an X-Y table is exposed by the light beam the surface of the wafer is often damaged by the descent of the reduction lens because one air-micrometer or electrostatic capacity sensor is provided to the wafer side and the other air-micrometer or electrostatic capacity sensor is provided to the X-Y table and the air-micrometer or the sensor provided to the X-Y table side cannot detect the height of the chips to be exposed.

In one attempt to solve the above-mentioned problems, a method for detecting the height of the wafer using reflected rays, i.e., the so-called focus detecting method utilizing reflected rays, is used. However, problems also occur when this method is used, as explained hereinafter.

SUMMARY OF THE INVENTION

The primary object of the present invention is to provide an automatic focus control device to be used in an exposure apparatus.

Another object of the present invention is to provide an automatic focus control device enabling a precise and automatic focus adjustment to be made to the position of the focus point.

In accordance with the present invention, there is provided an automatic focus control device used in an exposure apparatus comprising: a first light emitting means for emitting a first light ray to a sample; a second light emitting means for emitting a second light ray to the sample; a first light detecting means for detecting the second light ray reflected by a surface of the sample, and the first light detecting means having a plurality of light detecting elements; a second light detecting means for detecting the first light ray reflected by the surface of the sample, and the second light detecting means having a plurality of light detecting elements; and means for discriminating between an inclination of the sample and a variation of focus on the surface of the sample on the basis of an output of the first and second light detecting means; the first light emitting means and the first light detecting means being symmetrically located with respect to the second light emitting means and the second light detecting means in relation to a center axis of a light beam for exposing the sample.

In accordance with the above-mentioned structure of the present invention, it is possible to detect, precisely and automatically, the height of the sample wafer provided on the X-Y table and to adjust the position of the focal point on the surface of the sample.

DESCRIPTION OF THE PREFERRED EMBODIMENTS

Before describing the preferred embodiments, an explanation will be given of a conventional focus adjusting device and optical system. The conventional focus adjusting device performs adjustments by a focus detective method utilizing reflected rays (MURR), as shown in FIG. 1.

Figure 1:
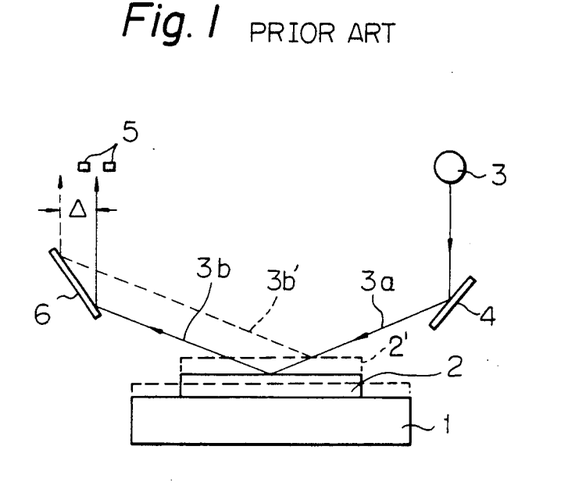
FIG. 1 is a schematic side view of a light detecting means of a conventional focus adjusting device and optical system.

Referring to FIG. 1, the wafer 2 is provided on the X-Y table. The incident rays 3a emitted by the light emitting means 3 are reflected by the reflecting mirror 4, and by the wafer 2. The reflected rays 3b are again reflected by the reflecting mirror 6 and detected by the detecting means 5, to determine the surface conditions of the wafer 2. Assuming that the surface of the wafer 2 moves to the position (wafer 2') indicated by the dotted line, the incident rays 3a are reflected by the surface indicated by the dotted line, and the reflected rays 3b' (dotted line) are reflected by the reflecting mirrors 6 and detected by the detecting means 5. The bumps or depressions on the surface of the wafer 2, i.e., the changes in height from the surface of the wafer 2, can be detected by measuring the gap Δ between the reflected rays 3b and the reflected rays 3b'.

Figure 2:
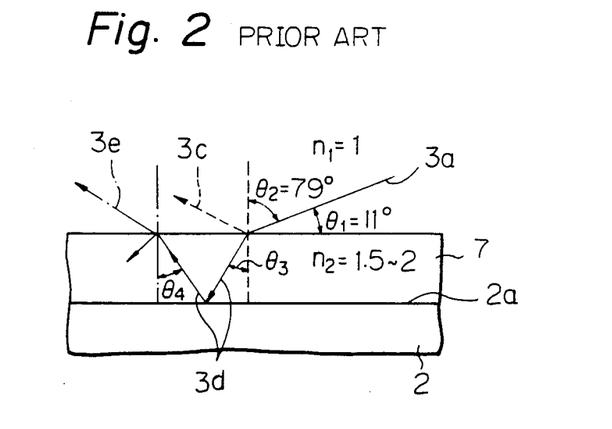
FIGS. 2 and 3 are schematic side views of a wafer indicating the relationship between the incident rays and reflected rays, to explain the drawbacks of the conventional focus adjusting device.

However, there are some problems regarding the above-mentioned conventional MURR method, these are explained with reference to the drawings (FIG. 2 and FIG. 3) as follows:

Referring to FIG. 2, when the transparent film 7 having a refractive index $n_2$ ($n_2 = 1.5$ to 2) is located on the reflecting face 2a of the wafer 2, a part of the incident rays 3a is reflected by the transparent film 7 as shown by 3C, and the other part of the incident rays 3a (shown by 3d) is transmitted by the transparent film 7 and reflected by the reflecting face 2a. The reflected rays 3d are transmitted again to the outside of the transparent film 7, and appear outside the film 7 in a medium having a refractive index $n_1$ ($n_1 = 1$) as shown by 3e. Since the detecting means 5 simultaneously detect these reflected rays 3c and 3e, the difference between 3c and 3e cannot be precisely detected.

As shown in FIG. 2, the incident angle $\theta_1$ of the incident rays 3a is usually $\theta_1 = 11°$ for the conventional stepper exposure apparatus. In this case, the refractive angle $\theta_3$ in the transparent film 7 is obtained by the following formula, $$n_1 \cdot \sin 79° = n_2 \cdot \sin \theta_3 \qquad (1)$$

where, the refractive index
$n_1 = 1$ and $n_2 = 1.5$ to 2, therefore,
$\theta_3 = 40.9°$ to $29.4°$, namely,
$\theta_3 = 40.9°$ (at $n_2 = 1.5$)
$\theta_3 = 29.4°$ (at $n_2 = 2$)

Next, the critical angle $\theta_4$ of the reflected rays 3d is obtained by the following formula, $$n_2 \cdot \sin \theta_4 / n_1 = 1 \qquad (2)$$

where,
$n_1 = 1$, $n_2 = 1.5$ to 2, therefore,
$\theta_4 = 41.8°$ to $30°$, namely,
$\theta_4 = 41.8°$ (at $n_2 = 1.5$)
$\theta_4 = 30°$ (at $n_2 = 2$)

As can be seen from the above-mentioned calculation, the critical angle $\theta_4$ (at $n_2 = 2$) of the reflected rays 3d is approximately equal to the refractive angle $\theta_3$ (at $n_2 = 2$). However, this means that a total reflection will occur on the surface of the resist coating if the incident angle $\theta_1 = 11°$, and $n_2 = 2$. Thus the incident angle 74 $_1 = 11°$ which occurs at the total reflection is not an appropriate angle.

Figure 3:
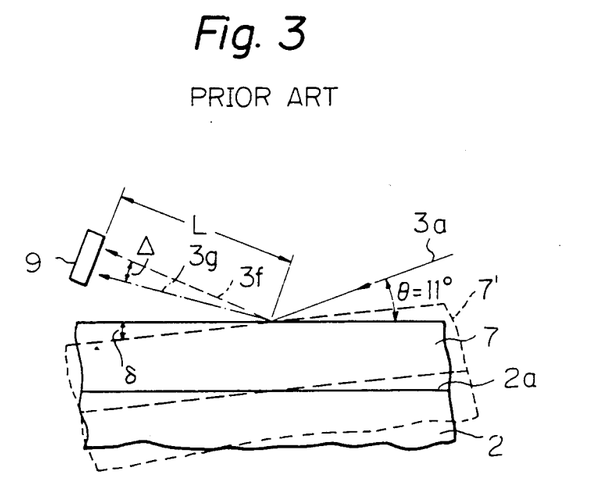

Other problems are explained with reference to FIG. 3. Referring to FIG. 3, when the surface of the resist coating film 7 is inclined, as shown by the dotted line 7', the reflected rays 3f change direction to the line shown by 3g according to the angle of incline δ of the surface of the film. Thus, the detecting means 5 detects the error caused by the gap Δ between the reflected rays 3f and 3g.

An automatic focus control device according to an embodiment of the present invention will be now described.

Figure 4:
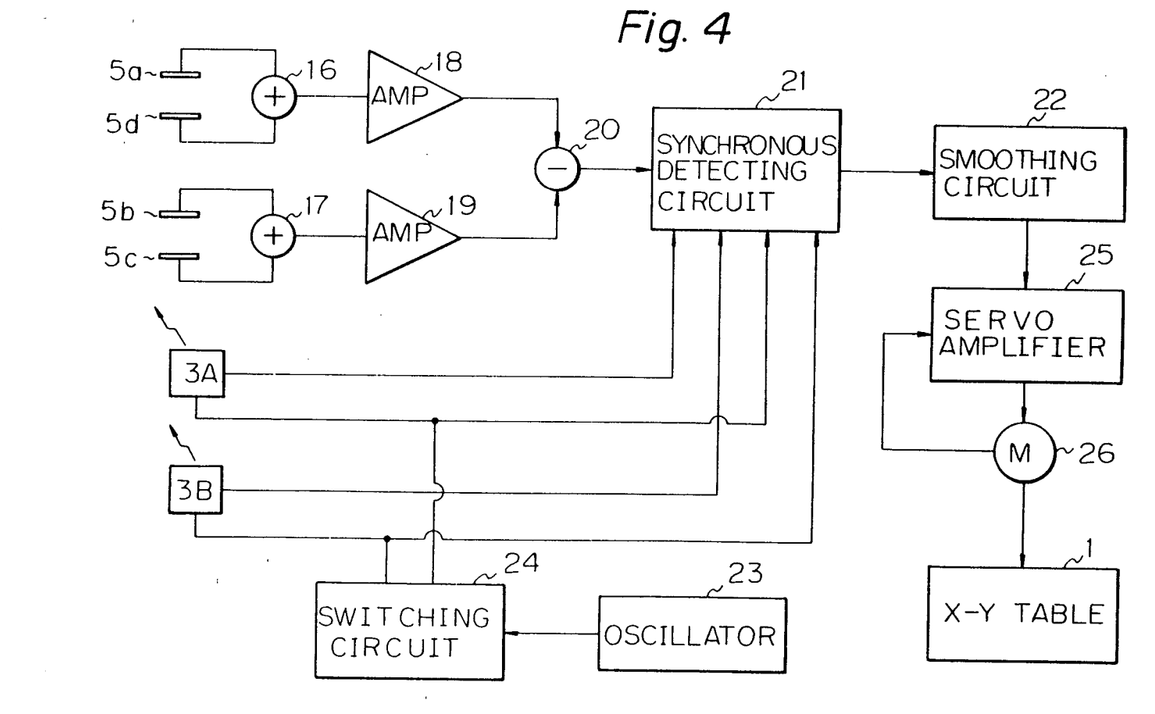
FIG. 4 is a basic block diagram of an automatic focus control device according to an embodiment of the present invention.
Figure 5:
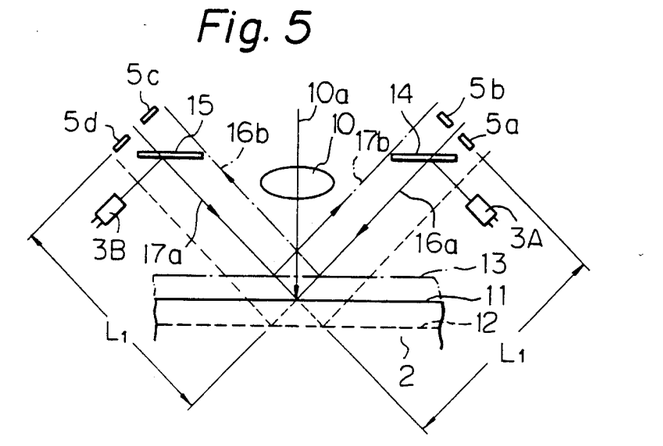
FIG. 5 is a schematic side view of an optical system of the device shown in FIG. 4.

Referring to FIGS. 4 and 5, light emitting means, for example, two visible light emitting diodes or infrared light emitting diodes, are shown by the reference letters 3A and 3B. Light detecting means comprising two pairs of detectors having a plurality of photocells for detecting the reflected rays 16b and 17b are shown by the reference letters 5a and 5b, and 5c and 5d, for example, photo-transistors or photo-diodes. The reduction lens, i.e., the exposure lens for projecting the light beam 10a, is shown by the reference numeral 10. First and second half-mirrors, provided in parallel with the surface of the wafer 2, are shown by the reference numerals 14 and 15. Each of the detecting means 5a and 5b, and 5c and 5d, and the first and second half-mirrors 14 and 15, are respectively located at positions symmetric to the center axis of the light beam 10a. Reference letter $L_1$ shows the distance between the focal point and the detecting means 5. Reference numerals 11, 12, and 13 show the focal surfaces. The numeral 11 shows the normal focus condition, the numeral 12 shows the rear focus condition, and the numeral 13 shows the front focus condition. Two adders 16 and 17 are provided for adding each output signal generated by the detecting means 5a and 5d, and 5b and 5c. The outputs of adders 16 and 17 are amplified by alternate amplifiers 18 and 19, respectively, and the outputs of alternate amplifiers 18 and 19 are applied to a subtracter 20. The output of an oscillator 23 is applied to a switching circuit 24 for switching the output of the oscillator 23, and the output of the switching circuit 24 is applied to the light emitting means 3A and 3B to alternately light 3A and 3B. At the same time, the output of the switching circuit 24 is applied to a synchronous detecting circuit 21. The synchronous detecting circuit 21 synchronously detects the outputs of the switching circuit 24 and the subtractor 20. The synchronous output of the synchronous detecting circuit 21 is applied to a smoothing circuit 22, and its output is applied to a servo amplifier 25. A drive motor 26 for controlling the position of the X-Y table 1 (shown in FIG. 1) is controlled by the output signal of the servo amplifier 25. Alternatively, the procedure for finding the difference between 5a and 5d or between 5b and 5c is not limited to the method mentioned in FIG. 4. For example, after the procedures for finding the difference between 5a and 5b or between 5c and 5d are performed, each difference may be added to each other. In this case, this circuit diagram (not shown) differs from the circuit diagram shown in FIG. 4.

In FIG. 4, since a wavelength of the light emitted by the first light emitting means 3A is the same as a wavelength of the light emitted by the second light emitting means 3B, they are lit alternately. However, when a wavelength of 3A differs from a wavelength of 3B, no alternate lighting is necessary, and the half-mirrors 14, 15 shown in FIG. 5 are not necessary. The operation of the device and optical system shown in FIGS. 4 and 5 will be explained below.

Figure 6:
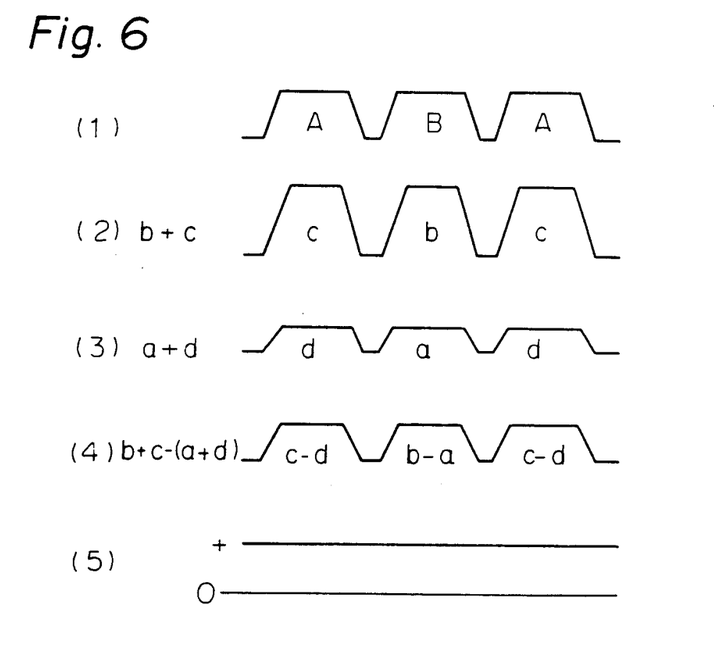
FIGS. 6 to 8 are waveform charts obtained from the optical system shown in FIG. 5.

FIG. 6 illustrates the waveform of the front focus condition when the position of the focal point of the reducing lens 10 is located below the surface 13 shown in FIG. 5.

Referring to FIG. 6, when the light emitting means 3A emits light having the waveform such as "A" shown in (1), the light emitted from 3A is reflected by the first half-mirror 14, and the incident rays 16a reflected by the half-mirror 14 are again reflected by the surface 13. The reflected rays 16b, shown by the chain dotted line, are almost all detected by the photocell 5c. The output of the photocell 5c then creates a high level output waveform such as "c" shown in (2). Meanwhile, the output of the photocell 5d creates a low level output waveform such as "d" shown in (3), because the reflected rays 16b are intercepted by the second half-mirror 15. These output waveforms "c" and "d" are applied to each adder 16 and 17 and the subtracter 20, and the differential signal output waveform (c-d) shown in (4) is obtained from the output of the subtracter 20.

When the light emitting means 3A extinguishes the light based on the signal transmitted from the switching circuit 24, the light emitting means 3B emits a light having the waveform such as "B" shown in (1). The light emitted from 3B is reflected by the second half-mirror 15. The incident rays 17a reflected by the mirror 15 are again reflected by the surface 13, and the reflected rays 17b shown by the chain dotted line are almost all detected by the photocell 5b. The output of the photocell 5b then creates a high level waveform such as "b" shown in (2). The output of the photocell 5a obtains a low level waveform such as "a" shown in (3), because the reflected rays 17b are intercepted by the first half-mirror 14. These output waveforms "a" and "b" are applied to each adder 16 and 17 and the subtracter 20. The differential signal waveform (b-a) shown in (4) is obtained from the output of the subtracter 20.

As mentioned above, the light emitting means 3A and 3B alternately emit the light based on the signal transmitted from the switching circuit 24, the outputs obtained from the detecting means 5a, 5b, 5c, and 5d are applied to the subtracter 20 via each of the adders 16, 17, the output of the subtracter 20 is applied to the synchronous detecting circuit 21, and the output of the synchronous detecting circuit 21 is applied to the smoothing circuit 22. The output level, indicating a constant plus voltage shown in (5), is obtained from the output of the smoothing circuit 22.

Accordingly, when the reflectivity of the wafer 2 is constant and the position of the focal point is located on the front focus condition, the output of the smoothing circuit 22 indicates the constant plus voltage, and the height of the X-Y table 1 is controlled by the servo amplifier 25 and the drive motor 26 so as to cause the table to descend until the plus output level of the smoothing circuit 24 is equal to a zero voltage level. Consequently, the surface 13 of the wafer 2 is adjusted to the focal point of the reduction lens 10 surface 11.

Figure 7:
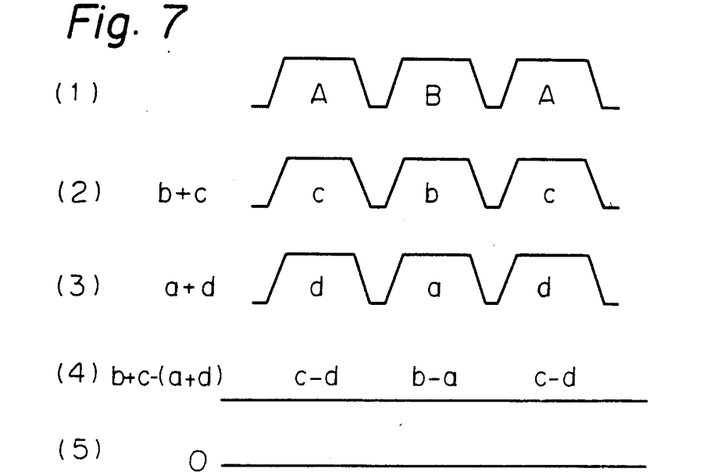

FIG. 7 illustrates the waveform of the normal focus condition when the position of the focal point of the reducing lens 10 is located on the surface 11 shown in FIG. 5. In this case, since the first and second half-mirrors 14 and 15 are positioned to the center portion of the light path of both reflected rays 16b and 17b, the detecting means 5a and 5b, and 5c and 5d all detect the same amount of light. Accordingly, when the light emitting means 3A emits a light having the waveform such as "A" shown in (1), the output of the photocells 5c and 5d obtain the high level waveforms such as "c" and "d" shown in (2) and (3). Similarly, when the light emitting means 3B emits a light having the waveform such as "B" shown in (1), the output of the photocells 5a and 5d creates the same high level waveform as "c" and "d", such as "a" and "b" shown in (2) and (3). These outputs obtained from the detecting means 5a, 5b, 5c, and 5d which are applied to the subtracter 20 via each of the adders 16 and 17, and the differential signal waveforms (c-d) and (b-a) shown in (4), are obtained from the output of the subtracter 20. The output of the subtracter 20 is applied to the smoothing circuit 22 via the synchronous detecting circuit 21, and the zero voltage output shown in (5) is obtained from the output of the smoothing circuit 22.

When the reflectivity of the wafer 2 is constant and the focal point is located at the normal focus position, i.e., the focal point is located at the surface of the wafer 2, the output of the smoothing circuit 22 indicates the zero voltage level, and the height of the X-Y table 1 is not controlled by the servo amplifier 25 and the drive motor 26.

Figure 8:
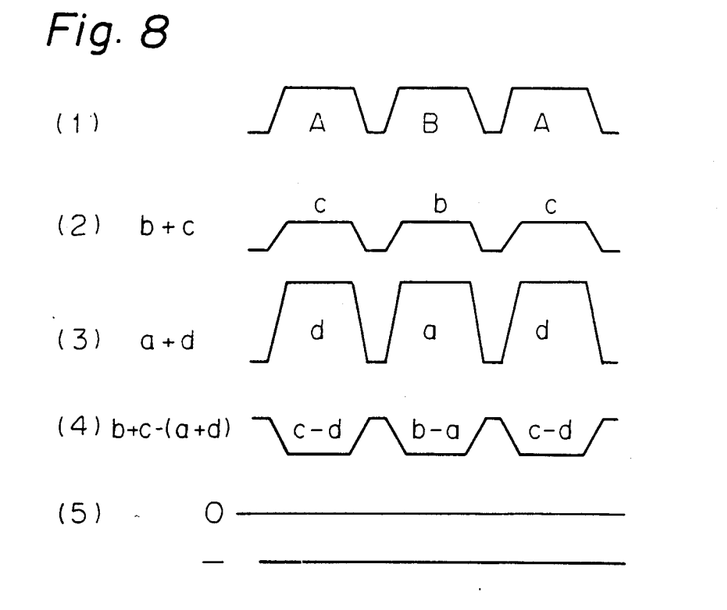

FIG. 8 illustrates the waveform of the rear focus condition when the position of the focal point of the reducing lens 10 is located above the surface 12 shown in FIG. 5. In this case, since the first and second half-mirrors 14 and 15 are located at positions opposed to those for the front focus condition as mentioned in FIG. 6, the outputs of the photocells 5a, 5b, 5c, and 5d obtain the inverse high level waveform such as "a", "b", "c", and "d" shown in (2) and (3). The outputs obtained from the detecting means are applied to the subtracter 20 via each of the adders 16 and 17, and the differential signal waveforms (c-d) and (b-a) shown in (4) are obtained from the output of the subtracter 20. The output of the subtracter 20 is applied to the smoothing circuit 22 via the synchronous detecting circuit 21, and the output level, indicating a constant minus voltage shown in (5), is obtained from the output of the smoothing circuit 22.

When the reflectivity of the wafer 2 is constant and the position of the focal point is located at the rear focus condition, i.e., the focal point is above the surface of the wafer, the output of the smoothing circuit 22 indicates a constant minus voltage, and the height of the X-Y table 1 is controlled by the servo amplifier 25 and the drive motor 26 so as to cause the table to elevate until the minus output level of the smoothing circuit 24 is equal to the zero voltage level. Consequently, the surface 13 of the wafer 2 is adjusted to the focal point of the reducing lens 10 at surface 11.

Another case, in which the surface of the wafer 2 is inclined, as shown by element 2a in FIG. 9, will be explained below.

Figure 9:
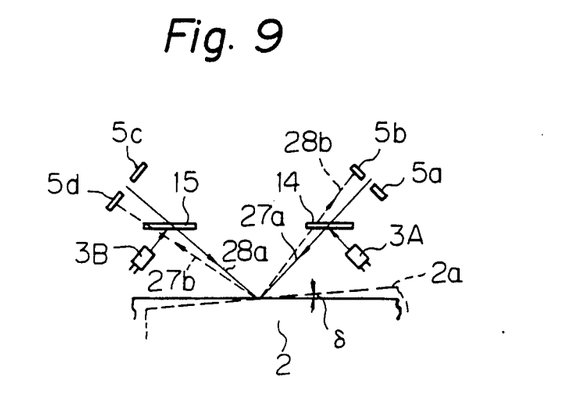
FIG. 9 is a schematic side view of the optical system shown in FIG. 5 in the case of an inclined wafer.
Figure 10:
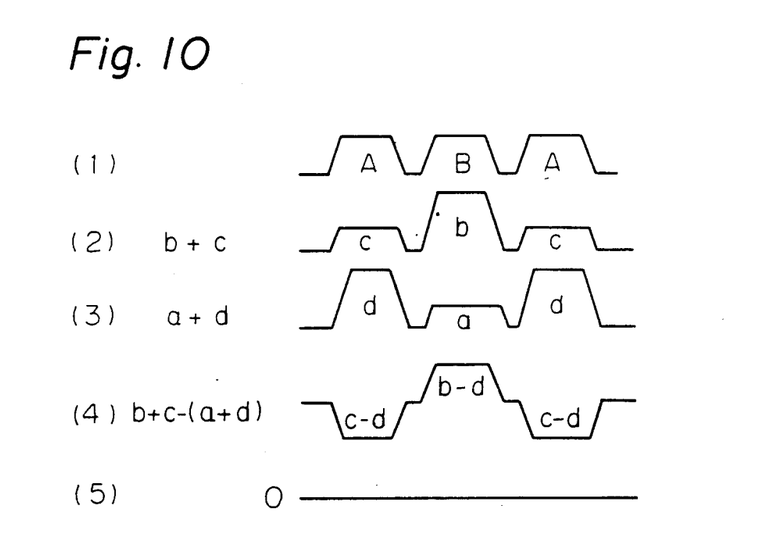
FIG. 10 is a waveform chart obtained from the optical system shown in FIG. 9.

Referring to FIG. 9, when the reflecting surface of the wafer 2 is horizontal, as shown by the solid line, both reflected rays 27b and 28b emitted alternately from the light emitting means 3A and 3B are detected by the photocells 5a and 5b, and 5c and 5d, and the zero level output is obtained from the smoothing circuit 22 as mentioned in FIG. 7. However, when the reflecting surface of the wafer 2 is inclined (as shown by the dotted line 2a) having an inclination angle δ, the incident rays 27a are reflected by the surface 2a, and almost all the reflected rays 27b are detected by the photocell 5d, but only a few are detected by the photocell 5c. Similarly, the incident rays 28a are reflected by the surface 2a, and almost all the reflected rays 28b are detected by the photocell 5b and only a few reflected rays are detected by the photocell 5a. The output levels of the detecting means 5a, 5b, 5c, and 5d, as shown in FIG. 10 (2) and (3), and are applied to the subtracter 20 via each of the adders 16 and 17. The differential signal waveforms (c-d) and (b-a) shown in FIG. 10 (4) are obtained from the output of the subtracter 20. The output of the subtracter 20 is applied to the smoothing circuit 22 via the synchronous detecting circuit 21, and the zero level output shown in FIG. 10 (5) is obtained from the output of the smoothing circuit 22. Consequently, when the position of the focal point is located on the surface of the normal focus condition, even if the reflecting surface of the wafer is inclined toward any direction, the height of the X-Y table 1 is not controlled by the servo amplifier 25 and the drive motor 26.

Still another case of the surface of the wafer 2, where the position of the focal point is adjusted to the normal focus condition, but the reflectivity of the surface of the wafer is different, is given below.

Figure 11:
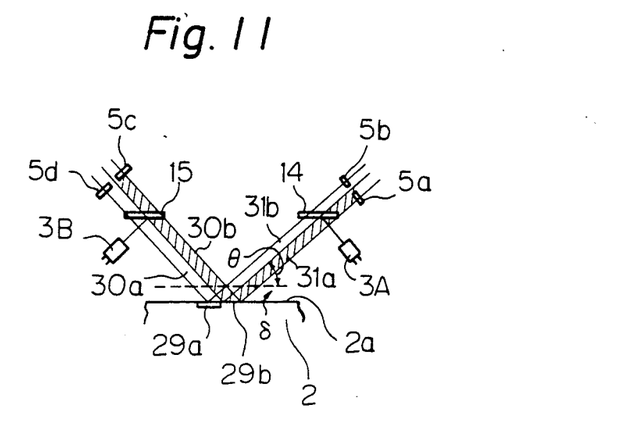
FIG. 11 is a schematic side view of the optical system shown in FIG. 5 in the case of the focal surface of the wafer having different reflectivity.

Referring to FIG. 11, on the reflecting surface 2a of the wafer 2, it is assumed that the portion shown as 29a has the reflectivity $n_1$, the portion shown as 29b has the reflectivity $n_2$, and that $n_1$ is larger than $n_2$.

As mentioned above, when the light emitting means 3A emits light, the light is reflected by the first half-mirror 14, the incident rays 31a and 13b, shown by an oblique line, are reflected by the reflecting surfaces 29a and 29b having different reflectivities, respectively, and the reflected rays 30b, shown by the oblique line, and 30a are detected by the photocells 5c and 5d via the second half-mirror 15. In the case of the reflectivity $n_1$ of high reflectivity portion and the reflectivity $n_2$ of low reflectivity portion, when a focusing area, having width l, length m, is illuminated by the light emitting means 3A and 3B, the light amount detected by the light detecting means 5a, 5b, 5c and 5d are represented by:

light amount $Ia = n_2 lm/2$
light amount $Ib = n_1 lm/2$
light amount $Ic = n_2 lm/2$
light amount $Id = n_1 lm/2$ thus, $$Ib + Ic - (Ia + Id) = \frac{1}{2}\{lm(n_1 - n_2) - lm(n_1 + n_2)\}$$

accordingly, the focal point is adjusted. In this case, since the reflectivity $n_1$ of 29a is larger than that of 29b, the photocell 5d detects a larger light amount that the light amount detected by the photocell 5c; thus the output obtained from the photocell 5d has a higher level waveform than that of the photocell 5c, as shown in FIG. 10 (2) and (3).

Similarly, when the light emitting means 3B emits light, the light is reflected by the second half-mirror 15, the incident rays 30a and 30b are reflected by the reflecting surfaces 29a and 29b, and the reflected rays 31a and 31b are detected by the photocells 5a and 5b via the first half-mirror 14. Thus, as mentioned above, the output obtained from the photocell 5b has a higher level waveform than output obtained from photocell 5a, as shown in FIG. 10 (2) and (3).

As shown in FIG. 10, the zero level shown in (5) is obtained from the output of the smoothing circuit 22, and the height of the X-Y table 1 is not controlled by the servo amplifier 25 and the drive motor 26.

Assuming that the position of the focal point has the front focus condition shown by dotted line in FIG. 11, i.e., the focal point is below the surface of the wafer 2, and the reflectivities $n_1$ and $n_2$ are in the above-mentioned condition, when the light output amount of each photocell 5a, 5b, 5c and 5d is represented by $Ia'$, $Ib'$, $Ic'$ and $Id'$, respectively, and the displacement of the focal point is represented by $\delta$, $$Ia' = n_2(lm/2 - 2\delta l/\tan\theta)$$

$$Ib' = n_1(lm/2 + \delta l/\tan\theta) + n_2 \delta l/\tan\theta$$

similarily, $$Ic' = n_2(lm/2 + \delta l/\tan\theta) + n_1 \delta l/\tan\theta$$

$$Id' = n_1(lm/2 - 2\delta l/\tan\theta)$$

$$Ib' + Ic' - (Ia' + Id') = 4\delta l(n_1 + n_2)/\tan\theta$$

Figure 12:
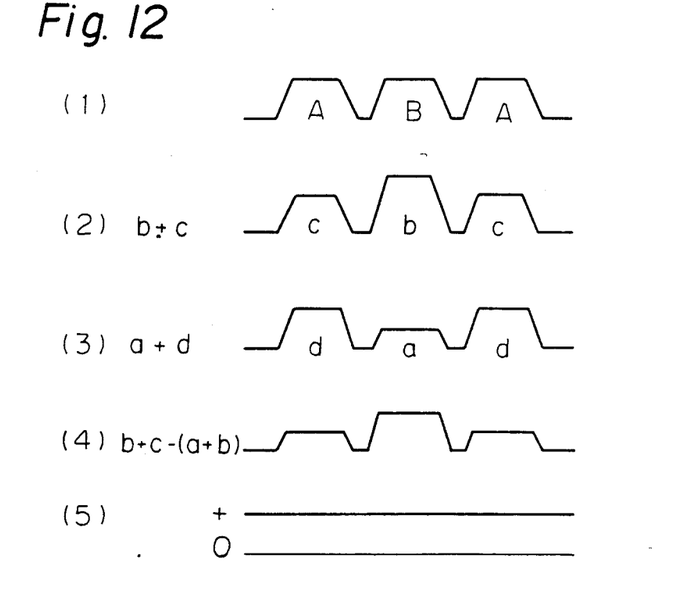
FIG. 12 is a waveform chart obtained from the optical system shown in FIG. 11.

Accordingly, when in the front focus condition, the control signal are obtained by the above-mentioned procedure. The waveforms in this case is shown in FIG. 12, the waveform level shown by $(b+c)-(a+d)$ obtained from the output of the smoothing circuit 22 indicates plus level output shown in (5), whereby, the height of the X-Y table 1 is controlled by the servo amplifier 25 and the drive motor 26.

I claim:

1. An automatic focus control device used in an exposure apparatus comprising:
    a first light emitting means for emitting a first light ray to a workpiece;
    a second light emitting means for emitting a second light ray to said workpiece;
    a first light detecting means for detecting said second light ray reflected by a surface of said workpiece, and said first light detecting means having a plurality of light detecting elements;
    a second light detecting means for detecting said first light ray reflected by said surface of said workpiece, said second light detecting means having a plurality of light detecting elements; and
    discriminating means, operatively connected to said first and second light detecting means, for discriminating between an inclination of said workpiece and a variation of focus on the surface of said workpiece on the basis of outputs of said first and second light detecting means;
    wherein said first light emitting means and said first light detecting means are symmetrically located with respect to said second light emitting means and said second light detecting means in relation to said surface of said workpiece.

2. An automatic focus control device as claimed in claim 1, wherein said first light emitting means and said second light emitting means emit light alternately.

3. An automatic focus control device as claimed in claim 1, wherein:
    said first light detecting means comprises a first detecting element and a second light detecting element;
    said second light detecting means comprises a third light detecting element and a fourth light detecting element; and
    said discriminating means comprises
        a first adder, operatively connected to said first light detecting means, for adding an output of said first light detecting element and an output of said third light detecting element,
        a second adder, operatively connected to said second light detecting means, for adding an output of said second light detecting element and an output of said fourth light detecting element, a subtracter, operatively connected to said first adder and said second adder, for finding the difference between an output of said first adder and an output of said second adder, and a smoothing circuit, operatively connected to said subtracter, for smoothing an output of said subtracter.

4. An automatic focus control device as claimed in claim 1, further comprising:

a first half-mirror and a second half-mirror, said first light ray being irradiated to said workpiece after being reflected by said first half-mirror, said first light ray being reflected by said workpiece and detected by said second light detecting means after being transmitted by said second half-mirror, and said second light ray being irradiated to said workpiece after being reflected by said second half-mirror and said second light ray being reflected by said workpiece and detected by said first light detecting means after being transmitted by said first half-mirror.

5. An automatic focus control device as claimed in claim 1, wherein said first light ray and said second light ray have the same wavelength.

6. An automatic focus control device as claimed in claim 1, wherein said first light ray and said second light ray have different wavelengths so that said first light ray and said second light ray do not interfere with each other.

7. An automatic focus control device as claimed in claim 1, wherein each of said first and second light emitting means comprises an infrared ray light emitting diode.

8. An automatic focus control device as claimed in claim 3, wherein each of said first, second, third and fourth light detecting elements comprises a photo-transistor.

9. An automatic focus control device as claimed in claim 3, wherein each of said first, second, third and fourth light detecting elements comprises a photodiode.

10. An automatic focus control device according to claim 3 further comprising means for varying outputs of said light detecting elements in accordance with a surface reflectivity of the workpiece when said surface reflectivity varies along the surface of the workpiece.

* * * * *

UNITED STATES PATENT AND TRADEMARK OFFICE
CERTIFICATE OF CORRECTION

PATENT NO. : 4,570,059  Page 1 of 3
DATED : February 11, 1986
INVENTOR(S) : Iijima It is certified that error appears in the above-identified patent and that said Letters Patent is hereby corrected as shown below:

[57] Abstract, line 7, delete "for".

Col. 1, line 9, after "tus," insert --and--;
      line 60, after "table" insert --side--.

Col. 3, line 20, after "method," insert --and--;
      line 63, "74" should be --$\theta$--.

Col. 6, line 42, "a" should be --the--.

Col. 7, line 33, "l" should be --$\ell$--;
      line 34, "amount" should be --amounts--;
      line 36, "$n_2 lm/2$" should be --$n_2 \ell m/2$--;
      line 37, "$n_1 lm/2$" should be --$n_1 \ell m/2$--;
      line 38, "$n_2 lm/2$" should be --$n_2 \ell m/2$--;
      line 39, "$n_1 lm/2$" should be --$n_1 \ell m/2$--;

UNITED STATES PATENT AND TRADEMARK OFFICE
CERTIFICATE OF CORRECTION

PATENT NO. : 4,570,059

DATED : February 11, 1986

INVENTOR(S) : Iijima

It is certified that error appears in the above-identified patent and that said Letters Patent is hereby corrected as shown below:

Col. 7, line 41, "1/2 { lm" should be $--1/2(\ell\ m)--$;

"$-lm(n_1 + n_2)$" should be $-- -\ell m(n_1 + n_2)--$;

line 67, "when" should be --then--.

Col. 8, line 4, "$(lm/2 - 2\ \delta l/\tan\theta)$" should be $-- \ell m/2 - 2\ \delta\ell/\tan\theta)--$;

line 6, "$(lm/2 - \delta l/\tan\theta)$" should be $--(\ell m/2 - \delta\ell/\tan\theta)--$;

line 9, "$(lm/2 + \delta\ l/\tan\theta)$" should be $--(\ell m/2 + \delta\ell/\tan\theta)--$;

line 9, "$(n_1\ \delta\ l/\tan\theta)$" should be $--(n_1\ \delta\ell\ /\tan\theta)--$;

UNITED STATES PATENT AND TRADEMARK OFFICE
CERTIFICATE OF CORRECTION

PATENT NO. : 4,570,059  Page 3 of 3
DATED : February 11, 1986
INVENTOR(S) : Iijima It is certified that error appears in the above-identified patent and that said Letters Patent is hereby corrected as shown below:

Col. 8, line 11, "($lm/2 - 2 \delta 1/\tan \theta$)" should be
--$\ell m/2 - 2 \delta\ell/\tan \theta$)--;

line 13, "$4\delta 1$(" should be --$4\delta\ell$(--;

line 16, "are" should be --is--;

line 17, "is" should be --are--.

Signed and Sealed this

First Day of July 1986

[SEAL]

Attest:

DONALD J. QUIGG

Attesting Officer

Commissioner of Patents and Trademarks